(12) United States Patent
Kawabata

(10) Patent No.: US 7,652,473 B2
(45) Date of Patent: Jan. 26, 2010

(54) MAGNETIC FIELD MEASURING OPTICALLY PUMPED MAGNETOMETER APPARATUS

(75) Inventor: Ryuzou Kawabata, Kodaira (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 12/155,982

(22) Filed: Jun. 12, 2008

(65) Prior Publication Data

US 2009/0001979 A1  Jan. 1, 2009

(30) Foreign Application Priority Data

Jun. 27, 2007 (JP) .............................. 2007-168373

(51) Int. Cl.
*G01V 3/00* (2006.01)
*H03L 7/26* (2006.01)
*G01R 33/032* (2006.01)

(52) U.S. Cl. ...................... 324/304; 324/301; 324/305; 331/94.1; 356/364

(58) Field of Classification Search ......... 324/300–322, 324/244.1; 600/409, 410, 411, 422; 331/94.1; 356/364

See application file for complete search history.

(56) References Cited

U.S. PATENT DOCUMENTS 3,150,313 A * 9/1964 Dehmelt ..................... 324/304

(Continued)

FOREIGN PATENT DOCUMENTS

JP  2001-339302  5/2000

(Continued)

OTHER PUBLICATIONS

G. Bison et al.; "A Laser-pumped Magnetometer for the Mapping of Human Cardiomagnetic Fields"; Applied Physics B, vol. 76, 2003, pp. 325-328.

(Continued)

*Primary Examiner*—Brij B. Shrivastav
*Assistant Examiner*—Tiffany A Fetzner
(74) *Attorney, Agent, or Firm*—Stites & Harbison PLLC; Juan Carlos A. Marquez, Esq.

(57) ABSTRACT

Providing: quickly brining a vapor cell 119 to a desired temperature when retaining the heat of the vapor cell 119 to enhance the magnetic field detection performance of an optically pumped magnetometer; preventing adherence of atoms in the vapor cell 119 to a laser irradiation light passing-through part of the vapor cell 119; downsizing the periphery of the vapor cell 119; and suppressing the effect of a magnetic field from a heater used to retain the heat of the vapor cell 119. The present invention includes: a transparent film heater 118 provided to a laser irradiation light passing-through part of a vapor cell 119, the vapor cell 119 being a magnetic detection part of the optically pumped magnetometer; a temperature detector 115 provided at a center part of a side of the vapor cell 119; a temperature regulator 111 that sets a desired temperature for heat retention of the vapor cell 119 and compares the desired temperature and the actual temperature of the vapor cell measured by the temperature detector 115; an operation unit 112 that upon receipt of a PID control signal for temperature control from the temperature regulator 111, performs a temperature adjustment and switches on/off, in a pulsed manner, current applied to the transparent film heater 118 after the desired temperature is reached; and a heater power supply 113 that upon receipt of an operation signal from the operation unit 112, applies current to the transparent film heater 118.

10 Claims, 5 Drawing Sheets

U.S. PATENT DOCUMENTS

| | | | | |
|---|---|---|---|---|
| 3,304,516 A * | 2/1967 | Novick et al. | | 331/94.1 |
| 3,387,207 A * | 6/1968 | Vessot | | 324/304 |
| 3,390,350 A * | 6/1968 | Davidovits et al. | | 331/94.1 |
| 3,418,565 A * | 12/1968 | Broussaud et al. | | 324/304 |
| 3,467,856 A * | 9/1969 | Hearn | | 324/304 |
| 3,500,176 A * | 3/1970 | Lehmann et al. | | 324/304 |
| 3,513,383 A * | 5/1970 | Hartline et al. | | 324/304 |
| 3,575,655 A * | 4/1971 | Dehmelt | | 324/304 |
| 3,577,069 A * | 5/1971 | Malnar et al. | | 324/305 |
| 3,584,292 A * | 6/1971 | Dehmelt | | 324/304 |
| 3,629,697 A * | 12/1971 | Bouchiat et al. | | 324/301 |
| 3,646,430 A * | 2/1972 | Hearn | | 324/304 |
| 3,701,005 A * | 10/1972 | Hartline | | 324/301 |
| 4,157,495 A * | 6/1979 | Grover et al. | | 324/302 |
| 5,053,708 A * | 10/1991 | Aspect et al. | | 324/304 |
| 5,227,722 A * | 7/1993 | Kostyk et al. | | 324/304 |
| 7,038,450 B2 * | 5/2006 | Romalis et al. | | 324/304 |
| 7,145,333 B2 * | 12/2006 | Romalis et al. | | 324/304 |
| 2003/0146796 A1 * | 8/2003 | Matsuura et al. | | 331/94.1 |
| 2004/0140799 A1 * | 7/2004 | Romalis et al. | | 324/301 |
| 2005/0052650 A1 * | 3/2005 | Wu | | 356/364 |
| 2005/0206377 A1 * | 9/2005 | Romalis et al. | | 324/301 |
| 2007/0167723 A1 * | 7/2007 | Park et al. | | 600/409 |
| 2008/0106261 A1 * | 5/2008 | Romalis et al. | | 324/304 |
| 2009/0001979 A1 * | 1/2009 | Kawabata | | 324/244.1 |

FOREIGN PATENT DOCUMENTS

| | | |
|---|---|---|
| JP | 2002-344314 | 5/2001 |
| JP | 2003-229766 | 2/2002 |

OTHER PUBLICATIONS

Peter D. D. Schwindt et al.; "Chip-scale Atomic Magnetometer"; Applied Physics Letters, vol. 85, No. 26, Dec. 27, 2004, pp. 6409-6411.

Zhimin Li et al.; "Parametric Modulation of an Atomic Magnetometer"; Applied Physics Letters, vol. 89, 2006, pp. 134105-1 to 134105-3.

J.M. Higbie et al.; "Robust, High-speed, All-optical Atomic Magnetometer"; Review of Scientific Instruments, vol. 77, 2006, pp. 113106-1 to 113106-7.

* cited by examiner

MAGNETIC FIELD MEASURING OPTICALLY PUMPED MAGNETOMETER APPARATUS

CLAIM OF PRIORITY

The present application claims priority from Japanese application JP 2007-168373 filed on Jun. 27, 2007, the content of which is hereby incorporated by reference into this application.

BACKGROUND OF THE INVENTION

1. Field of the Invention

The present invention relates to a technique for retaining the heat of a sensor part of an optically pumped magnetometer.

2. Background Art

In order to increase alkali metal atoms in a vapor cell which are excited by irradiation light applied to the cell, it is necessary to increase the gas density of the alkali metal in the cell by heating the cell. In order to retain the heat of the cell, there are techniques using hot air or heaters.

Appl. Phys. B76, 325-328 (2003) discloses that a cell is housed in a plastic coiled tube and the heat of the cell is retained by applying hot air to the inside of the tube using a hot air generator.

APPLIED PHYSICS LETTERS 85, 6409 (2004) discloses that transparent film heaters are provided to the parts through which irradiation light applied to a cell passes, and the heat of the cell is retained by applying current to the transparent film heater.

APPLIED PHYSICS LETTERS 89, 134105 (2006) discloses that hot air is applied to the inside of an oven housing a cell using a hot air generator to fill that container with hot air, thereby retaining the heat of the cell.

REVIEW OF SCIENCE INSTRUMENTS 77, 113106 (2006) discloses that hot air is applied using a hot air generator to the inside of a magnetic shielding provided to suppress environmental magnetic noise coming into a cell to fill the magnetic shielding with hot air, thereby retaining the heat of the cell.

JP Patent Publication (Kokai) No. 2001-339302A discloses that a c-field control circuit and a heater coil control-equipped temperature control circuit are prepared and a c-field coil wound on a cavity housing a cell is used as a heater by means of a coil function switch device, thereby retaining the heat of the cell.

JP Patent Publication (Kokai) No. 2002-344314A discloses that a film heater is provided to a c-field coil wound on a cavity housing a cell, or a cell, and current is applied to the film heater, thereby retaining the heat of the cell.

JP Patent Publication (Kokai) No. 2003-229766A discloses that a cell is housed in a metal case provided with a heater, and current is applied to the heater, thereby retaining the heat of the cell.

SUMMARY OF THE INVENTION

The system, in which a cell is housed in a plastic coiled tube and the heat of the cell is retained by applying hot air to the inside of the tube using a hot air generator, has an advantage in that there is no effect caused by a magnetic field because, unlike with a heater, the heat of the cell is retained not by an electric action. However, because of heating being performed indirectly, it requires a long time to bring the cell to a desired temperature. Also, alkali metal atoms enclosed in the cell adhere to the irradiation light passing-through parts of the cell because of the temperature difference between the irradiation light passing-through parts and the parts of the cell that are in contact with the tube, hindering the passage of the irradiation light. Furthermore, there are problems, for example, in that the periphery of the cell becomes large because thermal insulation is provided to the tube to prevent a temperature decrease.

The system, in which a transparent film heater is provided to the parts through which irradiation light applied to a cell passes and current is applied to the transparent film heater, thereby retaining the heat of the cell, has an advantage in that the cell is brought to a desired temperature more quickly, compared to the aforementioned heating technique using hot air in a tube. However, the magnetostatic field applied to the cell varies due to the effect of a magnetic field from the heater, lowering the accuracy of magnetic field measurement. Also, there are problems, for example, in that although the cell has been brought to a desired temperature, the fluctuation of the current value becomes large even though current applied to the heater is controlled, because the periphery of the cell is not thermally-insulated.

The system, in which hot air is applied to the inside of an oven housing a cell using a hot air generator to fill that container with hot air, thereby retaining the heat of the cell, has an advantage in that there is no effect of a magnetic field because, unlike with a heater, the heating is performed not by an electric action. Also, because the cell is heated directly in a hermetically sealed state, it has smaller temperature variations and is more quickly brought to a desired temperature compared to the aforementioned technique using hot air in a tube. However, irradiation light, which passes through the cell, wavers by the hot air, causing a problem in that the S/N ratio of the irradiation light that has passed through the cell, which is detected when performing magnetic measurement, may greatly deteriorate. Also, because of the use of hot air, the system becomes large as a result of thermal insulation provided to a hose from the cell to the hot air generator. The above problems also apply to the system in which hot air is applied using a hot air generator to the inside of a magnetic shielding provided to suppress environmental magnetic noise coming into a cell to fill the magnetic shielding with hot air, thereby retaining the heat of the cell.

The system, in which a c-field control circuit and a heater coil control-equipped control circuit are prepared and a c-field coil wound on a cavity housing a cell is used as a heater by means of a coil function switch device, thereby retaining the heat of the cell, has advantages in quick response to reach a desired temperature because of the use of a heater, and no effect of a magnetic field from a heater because of the use of a switch device. However, when using the coil as a heater, an accurate temperature cannot be obtained by measuring the outer side of the coil because a temperature increase in a coil exhibits a fairly large temperature gradient from the inner portion toward the outer portion. Also, a part of the cavity is heated using a heat transistor after the current applied to the heater coil is turned off, causing problems, for example, in that temperature variations occurs in the cell.

The system, in which a film heater is provided to a c-field coil wound on a cavity housing a cell, or a cell, and current is applied to the film heater, thereby retaining the heat of the cell, has advantages in quick response to reach a desired temperature because of the use of a heater, and smaller temperature variations in the cell compared to the aforementioned technique using a heater coil. However, the magnetostatic field applied to the cell varies due to the effect of a magnetic field from the film heater, hindering accurate magnetic field measurement.

The system, in which a cell is housed a metal case provided with a heater, and current is applied to the heater, thereby retaining the heat of the cell, has a good thermal conductivity and is excellent in quick response to reach a desired temperature because of the use of a metal case. However, a mechanism to let a magnetic field from a measurement target in the cell is required to perform magnetic field measurement, which makes the mechanism of the periphery of the cell be complicated as a result of, for example, a hole being provided in the metal case. Also, eddy current occurs in the metal case due to the effect of a magnetic field from the heater, which results in the magnetostatic field applied to the cell varies, hindering accurate magnetic field measurement.

In view of the aforementioned problems, an object of the present invention is to, in a heat retention system for a vapor cell, the cell being a sensor part of an optically pumped magnetometer, quickly bring the cell to a desired temperature, prevent irradiation light passage from being hindered by atoms in the cell adhering to the cell windows through which the irradiation light passes, and acquire data in magnetic measurement taking the effect of a magnetic field from a heater into consideration.

The present invention uses a cell with their window parts through which irradiation light passes formed of a conductive, temperature-controllable material and with the part of the cell other than the windows formed of a heat-resistant glass. By applying current to the window parts of the cell, the heat of the cell is retained, and by making the windows of the cell have a high temperature, the adherence of atoms to the windows is prevented.

According to an aspect of the present invention, a temperature sensor is provided at the center part of a cell between the windows, the temperature of the cell is monitored and the temperature is converted into an electrical signal and sent to a temperature regulator, and in the temperature regulator, a PID control signal is determined by calculation from the difference between a set temperature and the monitored temperature, and the temperature of the cell windows is controlled by an operation unit.

According to another aspect of the present invention, when the temperature of the cell windows is controlled by means of the PID control signal, the temperature of the cell monitored by the temperature sensor reaches a desired temperature, the current applied to the cell windows is switched on or off in a pulsed manner, and magnetic field measurement is conducted when the current applied to the conductive glass is off.

In a heat retention system for a cell according to the present invention, in order to monitor the effect of a magnetic field generated during pulsed current application to the cell windows, another reference cell using a conductive, temperature-controllable material in its irradiation light passing-through parts, as in the magnetic field measurement cell, is prepared. Current is constantly applied to the reference conductive glass, and the effect of a magnetic field due to the current application is detected by a deviation of the resonance frequency of a magnetooptical resonance signal obtained by applying an oscillating magnetic field from RF coils to the reference cell. Using the detected signal, a magnetic field from magnetostatic field application coils is corrected when current applied to the cell windows of the magnetic field measurement cell is on. Also, the magnetic field detection performances during current applied to the cell windows being on and off are determined by calculation from on the ratio between the S/N ratio and line width of the magnetooptical resonance signal to correct the magnetic field detection performance during current being on.

According to the present invention, since current is applied to conductive, temperature-controllable cell windows provided to irradiation light passing-through parts of a vapor cell, which is a sensor part of an optically pumped magnetometer to directly heat the cell, it is possible to quickly bring the cell to a desired temperature, compared to hot air heating using a conventional hot air generator, and also, since no components such as a hot air inflow tube used in the hot air-used techniques are required, the periphery of the cell can be downsized, and furthermore, adherence of atoms to the laser irradiation light passing-through parts of the cell can be prevented, making it possible to efficiently detect irradiation light. Furthermore, the temperature stability is enhanced because of the consideration of the effect of magnetic fields generated from the cell windows during current is applied. In other words, in the technique according to the present invention, when a desired temperature is reached by means of current application to a conductive glass, the current application is switched on or off in a pulsed manner to suppress the effect of a magnetic field from the conductive glass, and a reference cell is used to correct the magnetic field during current being on in pulsed current application, and the ratio between the S/N ratio and the line width of a magnetooptical resonance signal obtained by application of a RF magnetic field at this time is used to correct the magnetic field detection sensitivity, making consecutive magnetic field measurement possible even in a pulsed current application state.

Figure 1:
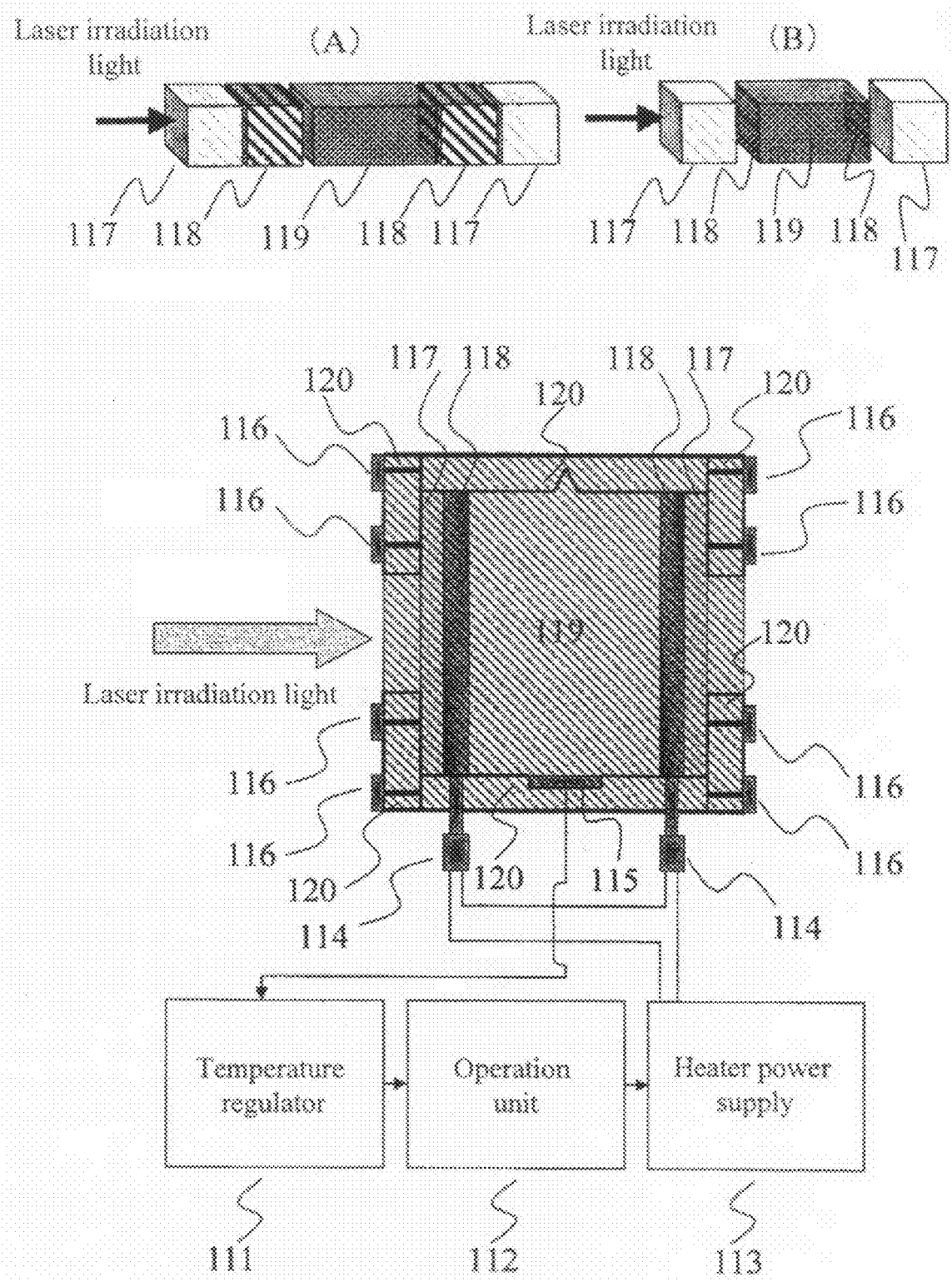
FIG. 1 illustrates an example configuration of a vapor cell heat retention system according to the present invention.

DESCRIPTION OF SYMBOLS 111 temperature regulator
112 operation unit
113 heater power supply
114 heater connector
115 temperature detector
116 nonmagnetic screw
117 heat-resistant glass
118 transparent film heater
119 vapor cell
120 nonmagnetic thermal insulating material
121 semiconductor laser
122 collimating lens
123 polarizer
124 wave plate
125 condensing lens 126 photodetector
127 magnetostatic field application coil
128 coil current source
129 RF coil
130 amplifier-filter circuit
131 phase comparator
132 loop filter
133 voltage-controlled oscillator
134 frequency divider
135 vapor cell heat retention system
136 reflecting mirror
137 beam splitter
138 measurement target
135 vapor cell heat retention system for reference sensor

DETAILED DESCRIPTION OF THE PREFERRED EMBODIMENTS

Hereinafter, an embodiment of the present invention will be described with reference to the drawings.

FIG. 1 is an example configuration of a vapor cell heat retention system according to the present invention, which uses a conductive, temperature-controllable material for cell windows to which a laser for retaining the heat of a vapor cell is applied.

FIG. 1(A) shows an example in which transparent film heaters are used for windows of a cell.

Heat-resistant glasses 117 are provided to irradiation light passing-through parts of a vapor cell 119, and a transparent film heater 118 is provided between the vapor cell 119 and each heat-resistant glass 117. A temperature detector 115 is provided in the center part of a side of the vapor cell 119, and a desired heat retention temperature for the vapor cell 119 set by a temperature regulator 111 and the temperature of the vapor cell 119 measured by the temperature detector 115 are compared by the temperature regulator 111 to determine the difference. Based on the above temperature difference, the temperature regulator 111 determines an operation signal for retaining the heat of the vapor cell 119, and sends the operation signal to an operation unit 112, and a volt-ampere adjustment signal for temperature control is input from the operation unit 112 to a direct current source 113 to apply current to the transparent film heater 118, thereby retaining the vapor cell 119 at the desired temperature.

FIG. 1(B) shows an example in which conductive glasses are used for windows of a cell.

The heat-resistant glasses 117 are provided to the irradiation light passing-through parts of the vapor cell 119, and the vapor cell 119 and the window parts of the vapor cell 119 are made of conductive glass. The temperature detector 115 is provided in the center part of a side of the vapor cell 119, and a desired heat retention temperature for the vapor cell 119 set by the temperature regulator 111 and the temperature of the vapor cell 119 measured by the temperature detector 115 are compared by the temperature regulator 111 to determine the difference. Based on the above temperature difference, the temperature regulator 111 determines an operation signal for retaining the heat of the vapor cell 119, and sends the operation signal to the operation unit 112, and a volt-ampere adjustment signal for temperature control is input from the operation unit 112 to the direct current source 113 to apply current to the conductive glasses 118, thereby retaining the heat of the vapor cell 119 at the desired temperature.

An optically pumped magnetometer using the aforementioned vapor cell heat retention system according to the present invention will be described using FIG. 2. The optically pumped magnetometer includes: an optical system including a semiconductor laser 121, which is a light source, a collimating lens 122, a polarizer 123, a wave plate 124, a condensing lens 125 and a photodetector 126; a magnetic system including magnetostatic field application coils 127, a coil current source 128 and RF coils 129; and a signal processing system including an amplifier-filter circuit 130, a phase comparator 131, a loop filter 132, a voltage-controlled oscillator 133 and a frequency divider 134.

An alkali metal such as kalium, rubidium or cesium is enclosed in a highly-vacuumed vapor cell, and the vapor density of the alkali metal in the vapor cell is enhanced by heating the vapor cell 119 to a preset temperature using the aforementioned vapor cell heat retention system 135. For example, it is preferable that: the temperature of the vapor cell is retained at the melting point of 28° C. or higher in the case of cesium, at the melting point of 64° C. or higher in the case of kalium, and at 39° C. or higher in the case of rubidium. A magnetostatic field is applied to the heated vapor cell 119 by the magnetostatic field application coils 127 and laser light from the semiconductor laser 121 is made to be parallel light by the collimating lens 122, converted into circularly-polarized light via the polarizer 123 and the wave plate 124 and applied to the vapor cell 119 in such a manner that it forms an angles of 45° relative to the magnetostatic field application direction. At this time, a RF magnetic field is applied by the RF coils 129 in a direction perpendicular to the magnetostatic field application direction, and laser irradiation light that has passed through the vapor cell 119 is collected by the condensing lens 125 and detected by the photodetector 126. The laser irradiation light detected by the photodetector 126 is input to the amplifier-filter circuit 130 for proper amplification and band processing, and is input to the phase comparator 131 as an input signal. At this time, a signal source for a RF magnetic field is input to the phase comparator 131 as a referenced signal from the voltage-controlled oscillator 133 via the frequency divider 134. The phase difference between the input signal and the reference signal in the phase comparator 131 is detected by means of lock-in detection and a magnetic field from a measurement target in the magnetostatic field application direction is detected by means of a clean direct current signal in which alternate current components obtained by the loop filter 132 are suppressed, or a signal from the voltage-controlled oscillator 133 which converts the direct voltage signal to a RF signal.

EXAMPLE 1

Example 1 of the present invention will be described using FIG. 1.

First, as an example of FIG. 1(A), the transparent film heaters 118 are provided to the laser irradiation light passing-through parts of the vapor cell 119, and current is applied to the transparent film heaters 118, thereby retaining the heat of the vapor cell 119. It is preferable that the vapor cell 119 and the transparent film heaters 118 are not bonded with an adhesive, etc., so that they can be replaced when they are deteriorated.

Also, in order to prevent a heat retention efficiency decrease caused as a result of the transparent film heaters 118 or the cell windows of the vapor cell using the conductive glass (ITO) shown in FIG. 1(B) being directly exposed to external air, the heat-resistant glasses 117 are required for the laser irradiation light passing-through parts of the vapor cell 119, and the transparent film heaters 118 are required between the heat-resistant glasses 117 and the vapor cell 119. At this time, the vapor cell 119, the transparent film heaters 118 and the heat-resistant glasses 117 are housed in a container of a nonmagnetic thermal insulating material such as Macor or Delrin, and the laser irradiation light passing-through parts are lidded with the nonmagnetic material. In order to fix the lid and the nonmagnetic material container to each other, it is necessary to secure them with nonmagnetic screws 116 of plastic, etc. The aforementioned configuration provides advantages not only in that the vapor cell 119 and the transparent film heaters 118 can be replaced when they are deteriorated, but also in the vapor cell 119 can freely be replaced when conducting a performance evaluation of the vapor cell 119.

Also, as shown in FIG. 1(B), where the size of the vapor cell 119 used or the pressures of an alkali metal and a buffer gas such as a noble gas or a nonmagnetic gas enclosed in the vapor cell are determined, in order to enhance the heat retention efficiency of the vapor cell 119, heat-resistant glasses with conductive glass (ITO) used for the transparent film heaters 118 embedded may be used for the laser irradiation light passing-through parts of the vapor cell. Although Example 2 onwards refers to the case where transparent film heaters 118 are used, of course, it should be understood that the case where cell windows formed of a conductive glass are used can also be employed.

EXAMPLE 2

Figure 2:
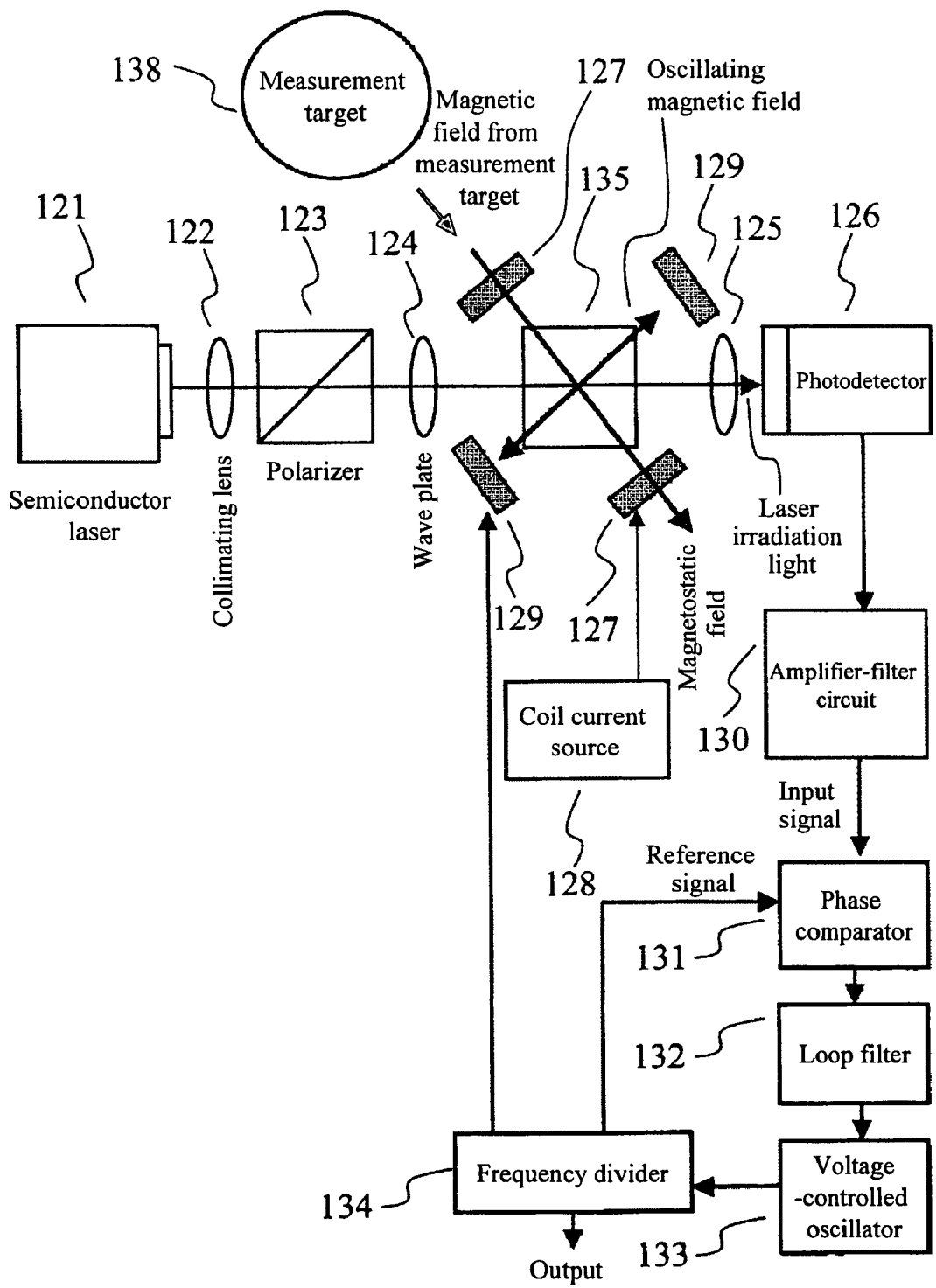
FIG. 2 illustrates an example of a magnetooptical resonance-type optically pumped magnetometer which includes a vapor cell heat retention system according to the present invention.

Example 2 of the present invention will be describe using FIG. 2. FIG. 2 shows an optically pumped magnetometer requiring a vapor cell heat retention system 135 according to the present invention, the system being a heat retention sensor part including a vapor cell heated by the transparent film heaters 118 shown in FIG. 1. Using the vapor cell heat retention system 135, the vapor cell 119 is heated to a desired temperature. Laser irradiation light from the semiconductor laser 121 is converted into circularly-polarized light via the collimating lens 122, the polarizer 123 and the wave plate 124, and the circularly-polarized light is irradiated to the vapor cell 119 to which a magnetostatic field is applied by the magnetostatic field application coils 127. At this time, a RF magnetic field is applied from the RF coils 129 in a direction perpendicular to the magnetostatic field application direction, and the laser irradiation light modulated by the RF magnetic field is detected by the photodetector 126 via the condensing lens 125. The laser irradiation light detected by the photodetector 126 is converted into an electrical signal, subjected to proper amplification and band processing via the amplifier-filter circuit 130, and input to the phase comparator 131 as an input signal. A signal from the voltage-controlled oscillator 133, which is a RF signal source for the RF magnetic field, is input to the phase comparator 131 as a reference signal via the frequency divider 134 to perform lock-in detection of the phase difference between the input signal and the reference signal, and a magnetic field from the measurement target entering the vapor cell 119 in the magnetostatic field application direction is detected as an output of the frequency divider 134.

Figure 3:
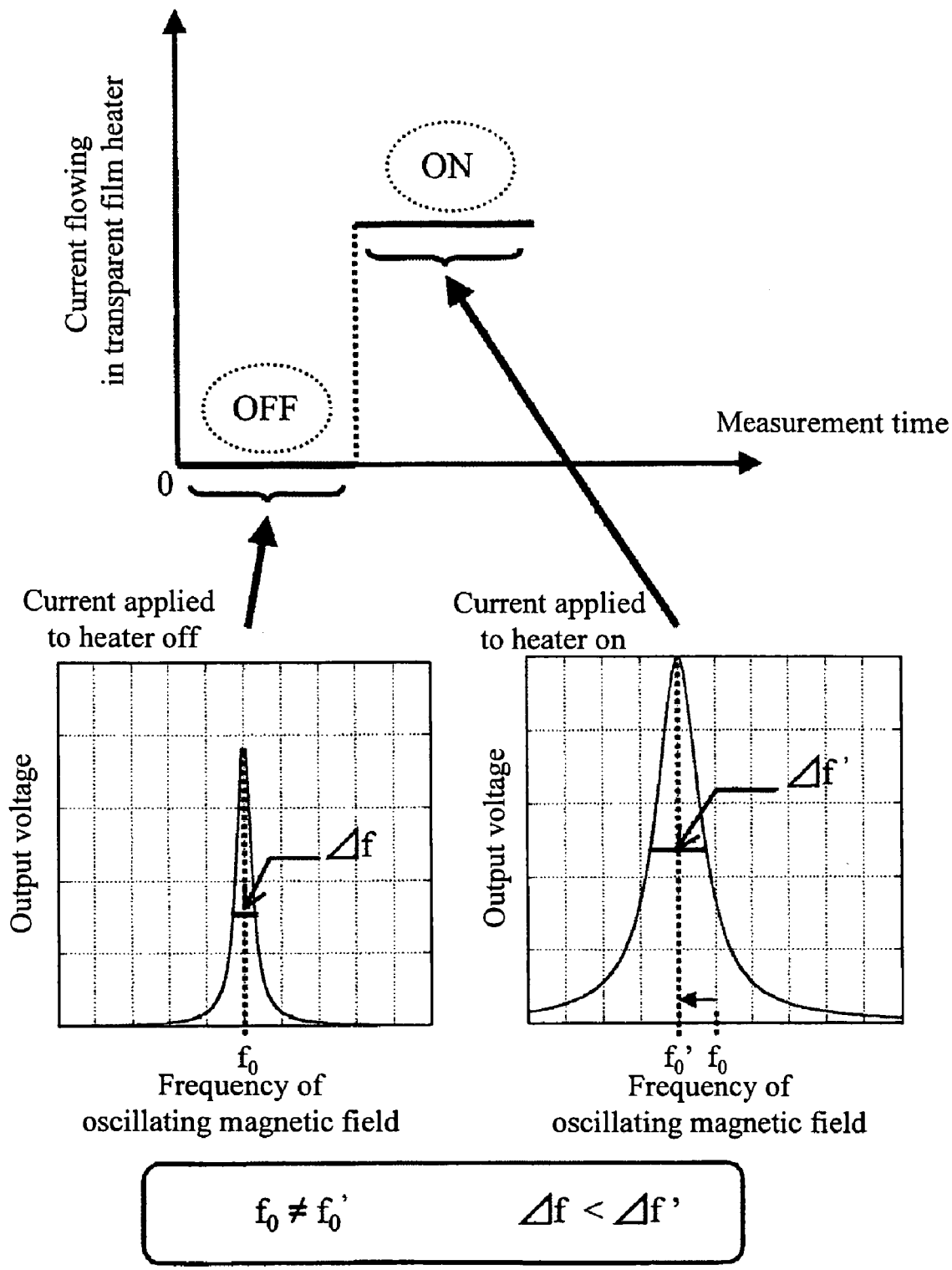
FIG. 3 illustrates the effect of a magnetic field from a transparent film heater in a vapor cell heat retention system according to the present invention on a magnetooptical resonance signal.

Since the vapor density of the alkali metal in the vapor cell 119 is increased by the vapor cell heat retention system 135, the S/N ratio of a signal detected by the photodetector 126 is improved, thereby improving the magnetic field detection sensitivity of the optically pumped magnetometer. However, a magnetic field generated as a result of current applied to the transparent film heaters 118 disrupt the strength of the magnetostatic field applied to the vapor cell 119, causing problems in that the optically pumped magnetometer does not normally operate or the magnetic field detection sensitivity is lowered. In reality, the resonance frequency $f_0$ of a magnetooptical resonance signal necessary for making the optically pumped magnetometer operate to perform magnetic field measurement is deviated relative to that in the state in which no current is applied to the transparent film heaters 118 and changed to $f_0'$, or the line width (full width at half maximum or half width at half maximum) $\Delta f$ becomes a broadened line width $\Delta f'$ (FIG. 3). Accordingly, if the vapor cell 119 reaches a desired temperature set in advance when heating the vapor cell 119 using the transparent film heaters 118, magnetic field measurement is performed in the state in which current applied to the transparent film heaters 118 is controlled to be in a pulsed manner, and a magnetic field signal from the measurement target 138, which is desired to be detected, is determined to be a signal obtained only during current applied to the transparent film heaters 118 being off. Here, the state in which applied current is off may be a state in which there is a sensitivity sufficient to detect the strength of a magnetic field to be measured although it is not the state in which no current is applied at all. Also, even when it is weak current close to zero, it is possible to detect the effect of magnetic field fluctuations caused by the transparent film heaters 118 by setting the cycle of a feedback control signal for magnetic field measurement to be twice or more times quicker than the cycle of a temperature signal for applying current to the transparent film heaters.

EXAMPLE 3

Figure 4:
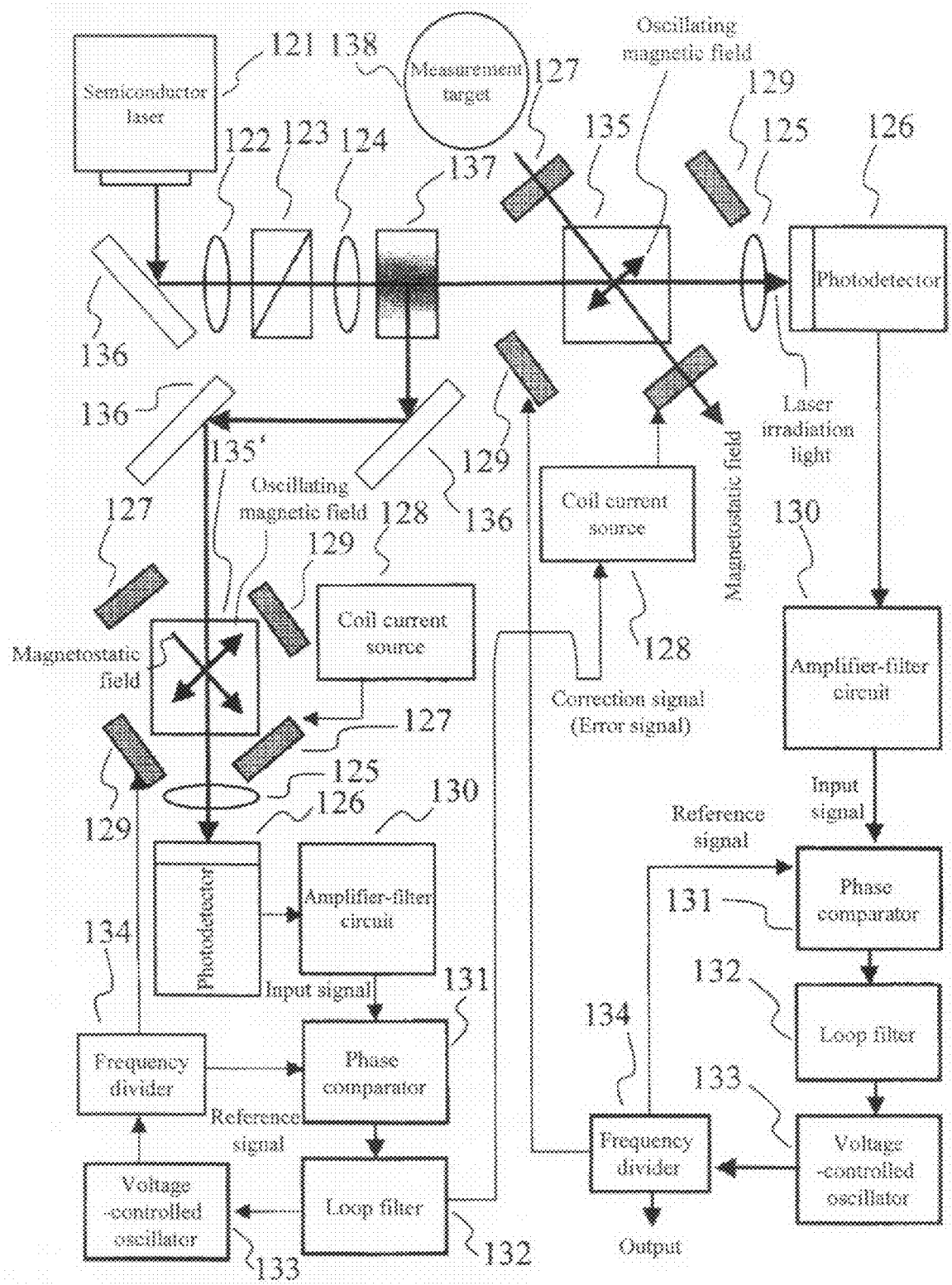
FIG. 4 illustrates an example configuration of a magnetooptical resonance-type optically pumped magnetometer having a reference sensor according to the present invention.

Example 3 of the present invention will be described using FIG. 4. As shown in FIG. 3, two vapor cell heat retention systems are required; one is used for a magnetic field measurement sensor, and the other is used for a reference sensor for determining the effect of current applied to the transparent film heaters 118.

Laser irradiation light from the semiconductor laser 121 is made to be parallel light by the collimating lens 122, and the laser irradiation light is split into two by means of a beam splitter 137 after it is converted into circularly-polarized light via the polarizer 123 and the wave plate 124. One of the laser irradiation light split into two is applied to the vapor cell 119 for the magnetic field measurement sensor, and the other is applied to the vapor cell heat retention system 135 including the vapor cell 119 for the reference sensor. Each vapor cell has the magnetostatic field application coils 127, and a magnetostatic field of the same strength is applied to each vapor cell 119. Also, each vapor cell 119 has the RF coils 129, and a RF magnetic field is applied to each vapor cell 119. Laser irradiation lights that have passed through the respective vapor cells 119 are collected by the respective condensing lenses 125, detected by the respective photodetectors 126 and converted into electrical signals and input to the respective amplifier-filter circuits 130 for proper signal amplification and band processing.

Lock-in detection of a phase is performed using the output from the respective amplifier-filter circuits 130 as input signals for the respective phase comparators 131, and using the output from the respective frequency dividers 134 via the respective voltage-controlled oscillator 133, which the respective sensors have for signal sources for the RF magnetic fields, as reference signals.

In the magnetic field measurement sensor, when the vapor cell 119 reaches a desired temperature, current applied to the transparent film heaters 118 included in the vapor cell heat retention system 135 is controlled to be in a pulsed manner.

Meanwhile, the vapor cell 119 for the reference sensor performs temperature control with a desired temperature set to be the same as that of the vapor cell 119 for the magnetic field measurement sensor; however, even when the desired temperature is reached, current applied to the transparent film heaters 118 is left constantly on. When the desired temperature is reached, the reference sensor is made to operate, thereby monitoring the variation of the resonance frequency of a magnetooptical resonance signal caused due to a magnetic field from the transparent film heaters 118. The output signal from the loop filter 132 obtained at this time, the signal exhibiting the variation of the resonance frequency, is input to the coil current source 128 for the magnetic field measurement sensor as a correction signal (error signal) to correct a deviation of the magnetooptical resonance signal occurring during current applied to the transparent film heaters being on when the temperature of the vapor cell 119 for the magnetic field measurement sensor is controlled in a pulsed manner, thereby changing the strength of the magnetic field applied to the vapor cell 119 to correct the deviation of the resonance frequency.

EXAMPLE 4

Figure 5:
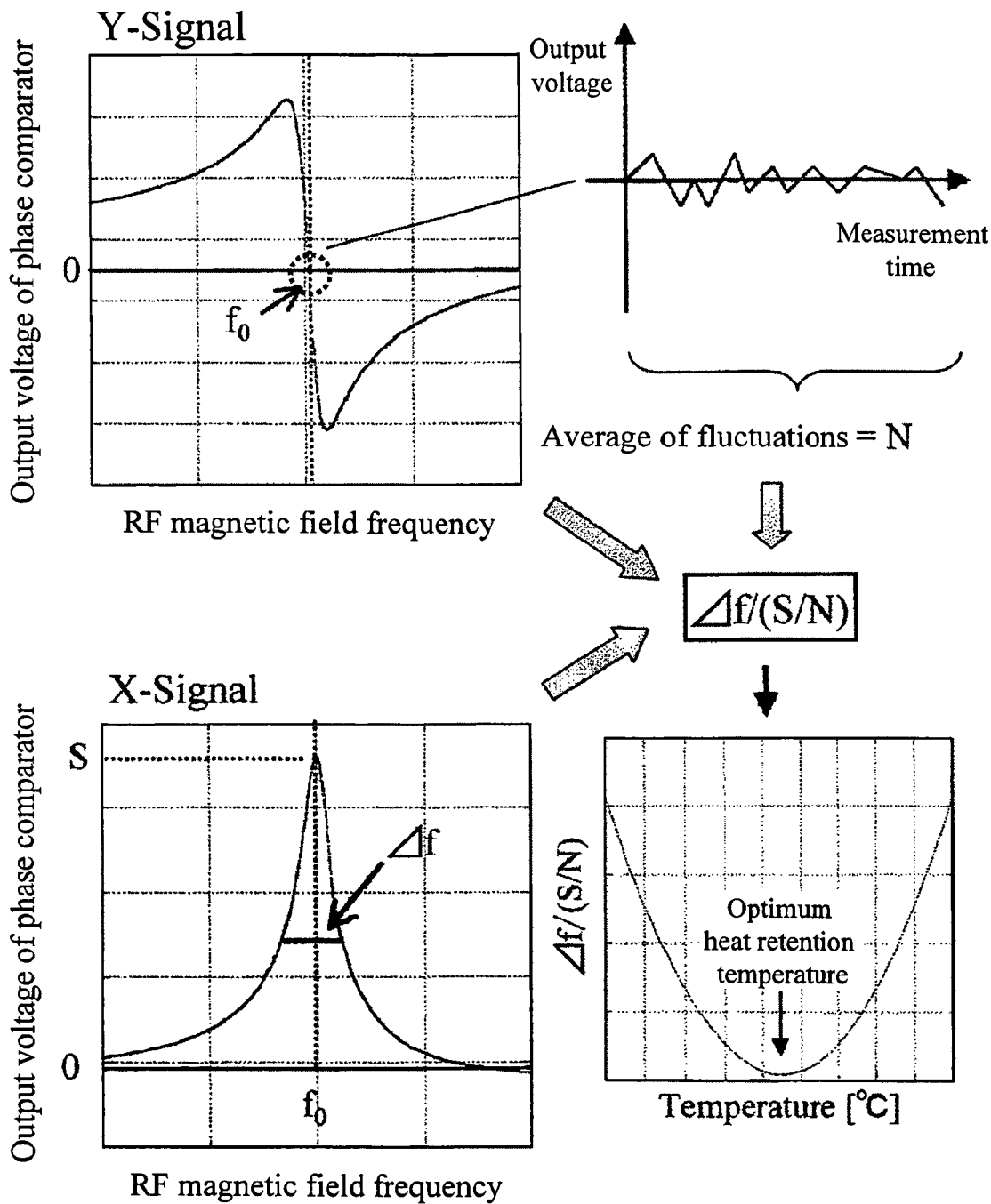
FIG. 5 illustrates a magnetooptical resonance signal-used definition for setting an optimum temperature condition to use a vapor cell heat retention system according to the present invention.

Example 4 of the present invention will be described using FIG. 5. For determining an optimum heat retention temperature for retaining the heat of the vapor cell 119 using the aforementioned cell heat retention system 135, a magnetooptical resonance signal obtained by sweeping the frequency of a RF magnetic field is used. Of two output signals from the phase comparator 131, a magnetooptical resonance signal, which is one of the output signals is an X-Signal, and the other output signal is a Y-Signal in a dispersed form, which is obtained by first derivation of the X-Signal. There exhibited a characteristic in that at the frequency that resonates with that of a RF magnetic field (hereinafter, referred to as "resonance frequency"), the output of the X-Signal exhibits a peak value (hereinafter, referred to as "S"), and the output value of the Y-Signal becomes zero. After detecting the magnetooptical resonance signal, the frequency of the output signal from the voltage-controlled oscillator 133 is set to the resonance frequency, and the fluctuations of the output of the Y-Signal in a state in which there is no magnetic field from the measurement target 138 is measured, and the average value of the fluctuations is made to be N. Also, the line width $\Delta f$ (half width at half maximum or full width at half maximum) of the obtained magnetooptical resonance signal is calculated, and the cell heat retention temperature when the value of $\Delta f/(S/N)$ becomes minimum is determined to be an optimum temperature condition. As a result of defining an optimum temperature condition in this manner, the advantage of being able to perform stable measurement can be obtained. This reflects that as the (S/N) is larger, the more efficiently alkali metal atoms in the cell are absorbed into the laser light, and also reflects that as $1/\Delta f$ is larger, the longer the time during which the modulation of the laser light due to a RF magnetic field after passing through the cell can 119 be retained is, and thus exhibits the effect to achieve a high sensitivity in the optically pumped magnetometer. In other words, the value of $\Delta f/(S/N)$ reflects the degree of the detection sensitivity of the optically pumped magnetometer. Based on these matters, the magnetic field measurement signal during current applied to the transparent film heaters being on is corrected by comparing the $\Delta f/(S/N)$ during the current being on and the $\Delta f/(S/N)$ during the current being off when the current is switched on/off in a pulsed manner.

The vapor cell heat retention system 135 according to the present invention serves to enhance the sensitivity of magnetic field detection by an optically pumped magnetometer, and can be used for enhancing the performances of various magnetic field measurements such as geomagnetic monitoring, metal detection, biomagnetic measurement and magnetic immunological tests. Also, it can be used for an atomic clock using a vapor cell, and is involved in performance enhancement of technologies requiring highly-accurate timing, such as satellite communication, GPS, cellular phone and radar. Furthermore, it can be used for performance evaluation of a vapor cell produced for use in the aforementioned applied technologies.

What is claimed is:

1. An optically pumped magnetometer comprising:
    A first glass cell with an alkali metal enclosed therein, the first glass cell having a conductive window part through which laser irradiation light applied to the first glass cell passes;
    a temperature detector measuring a temperature of the first glass cell;
    a control part that applies current onto the conductive window part in order to retain and control heat in the conductive window part, based on the temperature measured by the temperature detector; and
    a magnetic field measurement part that performs magnetic field measurement.

2. The optically pumped magnetometer according to claim 1, wherein the conductive window part is made of conductive glass.

3. The optically pumped magnetometer according to claim 1, wherein the conductive window part includes a film heater that is transparent to the laser irradiation light.

4. The optically pumped magnetometer according to claim 1, wherein the control part receives from the temperature detector a signal indicating when that the first glass cell has reached a set temperature, and switches the current applied to the conductive window part in a pulsed on/off manner in order to make the magnetic field measurement part perform magnetic field measurement when the current is switched off.

5. The optically pumped magnetometer according to claim 4, further comprising:
    a beam splitter that splits the laser irradiation light into first and second laser irradiation lights, the first laser irradiation light being applied to the first glass cell; and
    a correction part including a second glass cell into which the second laser irradiation light split by the beam splitter is applied, the second glass cell having a conductive window part through which the second laser irradiation light applied to the second glass cell passes, the correction part correcting a deviation of a frequency of a magnetooptical resonance signal, the deviation being caused by a magnetic field generated during the application of the current to the conductive window part of the second glass cell, by controlling the current applied to the conductive window part of the second glass cell to be constantly on.

6. The optically pumped magnetometer according to claim 1, wherein the control part sets a cycle of a temperature control signal to be longer than a feedback control cycle of magnetic field measurement, the feedback control cycle being determined by the combination of a phase comparator, a loop filter, a voltage-controlled oscillator and a frequency divider included in the magnetic field measurement part.

7. The optically pumped magnetometer according to claim 4, wherein the magnetic field measurement part corrects a magnetic field detection sensitivity while the current is being applied to the conductive window part of the first glass cell with the pulse control switch being on, based a ratio between a line width of a magnetooptical resonance signal obtained by sweeping a frequency of an RF magnetic field from an RF coil and an S/N ratio of the magnetooptical resonance signal, the S/N ratio being a ratio between a resonance value of the magnetooptical resonance signal and an output value fluctuation of a first derivative of the magnetooptical resonance signal at a resonance frequency.

8. The optically pumped magnetometer according to claim 1, wherein a set temperature, which is a temperature controlled by the control part, is a temperature at which a ratio between a line width of a magnetooptical resonance signal obtained by sweeping a frequency of an RF magnetic field from an RF coil and an S/N ratio of the magnetooptical resonance signal is minimum.

9. The optically pumped magnetometer according to claim 1, wherein the metal is one of kalium, rubidium or cesium.

10. The optically pumped magnetometer according to claim 1, wherein the first glass cell is made of heat-resistant glass or quartz glass.

* * * * *